Dec. 13, 1966 E. F. CAVE 3,290,760

METHOD OF MAKING A COMPOSITE INSULATOR SEMICONDUCTOR WAFER

Filed Dec. 16, 1963 2 Sheets-Sheet 1

INVENTOR.
ERIC F. CAVE
BY
W. S. Hill
ATTORNEY

METHOD OF MAKING A COMPOSITE INSULATOR SEMICONDUCTOR WAFER

Filed Dec. 16, 1963 2 Sheets-Sheet 2

INVENTOR.
ERIC F. CAVE
BY
[signature]
ATTORNEY

United States Patent Office 3,290,760
Patented Dec. 13, 1966

3,290,760

METHOD OF MAKING A COMPOSITE INSULATOR SEMICONDUCTOR WAFER

Eric F. Cave, Somerville, N.J., assignor to Radio Corporation of America, a corporation of Delaware Filed Dec. 16, 1963, Ser. No. 330,690
6 Claims. (Cl. 29—155.5)

This invention relates to an improved method of making a composite insulator-semiconductor wafer. The improved wafer of the present invention is especially useful in integrated circuits.

It has been proposed to use composite glass-semiconductor wafers for certain electronic components, such as integrated circuits. These prior art, composite wafers comprise a plurality of semiconductor material separated from, and insulated from, each other by glass. While these composite glass-semiconductor wafers are suitable for many applications, they are not desirable for use in some manufacturing processes where temperatures higher than the melting point of the glass are involved, as where elements with relatively high melting points are diffused into the semiconductor material of the composite wafer. Also, glass may contain impurities that can dope the semiconductor material adversely. In manufacturing composite glass-semiconductor wafers, special procedures are usually used for grinding away excess glass to expose a surface of the semiconductor material in which active electronic components are to be formed.

It is an object of the present invention to provide an improved method of making a composite wafer that tends to eliminate, or markedly reduce, the aforementioned disadvantages of prior art wafers, either composite or monolithic.

Another object of the present invention is to provide an improved method of making a composite insulator-semiconductor wafer, useful in integrated circuit structures, to reduce parasitic interactions, excessive current leakages, and spurious signals.

Still another object of the present invention is to provide an improved method of making a composite silicon dioxide-silicon wafer that can withstand the relatively high temperatures used to diffuse certain elements into silicon in the process of forming active components therein.

A further object of the present invention is to provide an improved method of making a composite insulator-semiconductor wafer of the type described that is relatively simple in construction, easy to use in integrated circuits, and highly efficient in use.

Briefly stated, the improved, composite insulator-semiconductor wafer made in accordance with the improved method described herein comprises a wafer-like structure of a plurality of pieces of semiconductor material, such as silicon, electrically insulated from each other by, and bonded together by, an oxide that may be the oxide of the semiconductor material. In one form of the invention, the improved composite wafer comprises a plurality of strips of silicon bonded to each other by fused silicon dioxide. In another form of the invention, the improved composite wafer comprises a plurality of discrete pieces of silicon that are insulated from each other and held together in a checkerboard-like wafer structure by fused silicon dioxide. Active components may be produced in portions of the semiconductor material by diffusing suitable elements into the semiconductor material in accordance with known techniques.

The improved, composite insulator-semiconductor wafer of the invention may be manufactured by the method of the present invention, one example of the method being as follows: Each of a plurality of cleaned sheets of semiconductor material, such as silicon, is oxidized to form a layer of silicon dioxide thereon of a desired thickness. The oxidized sheets are superimposed on each other, major surface to major surface, to form a stack. Pressure is applied to the stack while its temperature is raised to cause adjacent oxidized sheets to become bonded (fused) to each other. Slices of the stack are cut perpendicularly to the major surfaces of the oxidized sheets of the stack. Each slice is a wafer-like structure comprising a plurality of strips of silicon separated from each other by fused silicon dioxide, an electrical insulator, and having exposed major surfaces normal to those of the original major surfaces. Each of a plurality of slices of the parallel strips may now be oxidized further to form an oxide of desired thickness thereon, and the oxidized slices are superimposed on each other to form another stack. The latter stack is compressed and subjected to heat until adjacent oxidized slices are bonded (fused) to, and insulated from, each other by silicon dioxide. The stack is sliced at an angle to the major surfaces of each of the slices therein in a manner to provide checkerboard-like composite wafers wherein discrete pieces of silicon are bonded to, and insulated from, each other by the oxide of silicon.

The novel features of the present invention, both as to its organization and method of operation, as well as additional objects and advantages thereof, will be more readily understood from the following description, when read in connection with the accompany drawings in which similar reference characters represent similar parts throughout, and in which.

Figures 7, 8, 9:
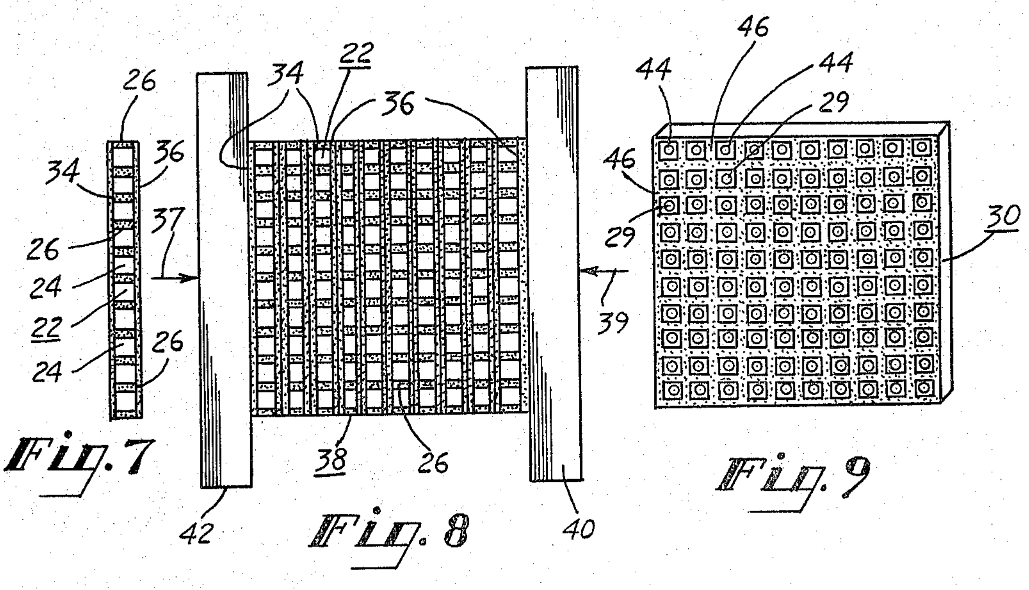
FIG. 7 is an end elevational view of an oxidized wafer of the type illustrated in FIGS. 4 and 5.

FIG. 8 is a stack of oxidized wafers, of the type illustrated in FIG. 7, under pressure during one of the steps in the method of making composite wafers in accordance with the present invention; and FIG. 9 is another form of a composite wafer in accordance with the present invention, obtained by making a slice through the stack of oxidized wafers illustrated in FIG. 8 after adjacent slices in the latter stack have been fused to each other.

Figures 1, 2:
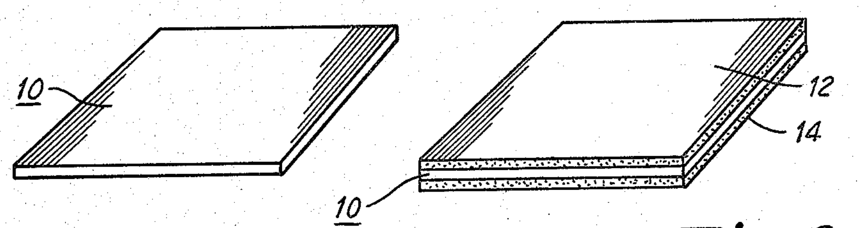
FIG. 1 is a perspective view of a sheet of semiconductor material used in the manufacture of a composite insulator-semiconductor wafer by the method of the present invention.
FIG. 2 is a perspective view of a sheet of semiconductor material whose opposed major surfaces have been oxidized.

Referring, now, particularly to FIG. 1, there is shown a sheet 10 of semiconductor material, such as silicon. The sheet 10 is preferably of rectangular shape and is formed from a single crystal of suitable doped semiconductor material, such as N-type or P-type silicon, germanium, or gallium-arsenide, for example. When used in the manufacture of certain integrated circuits, the sheet 10 may be one inch square and about 25 mils thick, for example. The sheet has two, major, opposed parallel surfaces.

An electrically insulating and physically binding oxide is deposited or formed on the two major surfaces, which, as viewed in FIG. 1 or 2 are the upper and lower surfaces of the sheet 10, by any suitable method known in the art. For example, the sheet 10 of silicon may be oxidized by heating it in steam, containing air and/or pure oxygen, to a temperature between 1200 and 1250° C. until the major surfaces of the sheet 10 are covered with upper and lower oxide layers 12 and 14 of a desired thickness, as shown in FIG. 2. Where the sheet 10 is of silicon, the oxide layers 12 and 14 are silicon dioxide. A suitable oxide may also be formed on the sheet 10 by heating it in steam containing silicon tetrachloride or in a hydrogen carrier containing silicon tetrachloride and carbon dioxide, in a manner known in the art. Suitable oxides may also be formed on the sheet 10 by the decomposition of organic oxysilane compounds by known techniques. The oxide coated sheet 10 in FIG. 2 is shown with its peripheral edges trimmed so that the silicon sheet 10 can be seen plainly between the oxide layers 12 and 14. However, it is not necessary that the edges of the sheet 10 be trimmed.

A plurality of oxidized sheets 10 are superimposed on each other to form a stack 16 wherein the upper oxide layer 12 of a sheet 10 is adjacent to the lower oxide layer 14 of the next higher adjacent sheet 10. The number of oxidized sheets 10 in any stack 16 will depend upon the size of the ultimate composite wafer desired. In the stack shown in FIG. 3, 10 sheets 10 are superimposed on each other to form the stack 16. The sheets 10 in the stack 16 may be either of similar or dissimilar material. For example, where one sheet 10 in the stack is of N-type semiconductor material, an adjacent sheet 10 may be of a P-type semiconductor material, depending upon the ultimate composite wafer desired.

Figure 3:
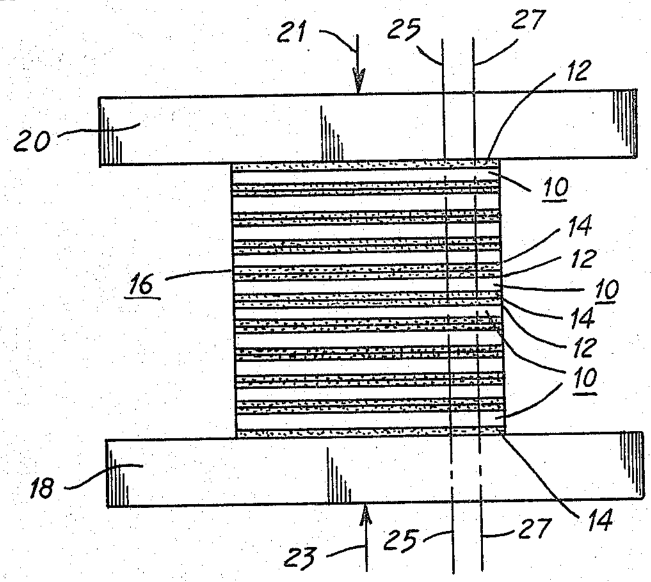
FIG. 3 is a front elevational view of a stack of oxidized sheets of semiconductor material under pressure in one of the steps in the method of making composite wafers in accordance with the present invention.

The stack 16 is placed between parallel blocks 18 and 20 of graphite to prevent scratching of the lower oxide layer 14 and upper oxide layer 12 of the lower most and upper most sheets 10, respectively, of the stack 16, and the entire assembly is placed in a press (not shown) wherein the stack 16 is compressed by forces in the directions normal to the major surfaces as indicated by the arrows 21 and 23 in FIG. 3. Depending upon the oxide and material of the sheet 10, the pressure applied between the blocks 18 and 20 may be from about 100 p.s.i. to about 2,000 p.s.i. While the pressure is applied, the stack 16 is heated, for example, in an induction furnace (not shown), to a temperature at which the oxide layers 12 and 14 soften, usually between 1200° C. and 1250° C. for silicon, for example. Under these conditions, of heat and pressure, adjacent oxide layers 12 and 14 of adjacent sheets 10 in the stack 16 fuse, that is, become bonded, to each other in about three minutes, and the stack 16 becomes an integral structure. The melting point of the oxide layers 12 and 14 may be lowered by modifying them with another oxide, such as $Al_2O_3$, $B_2O_3$ or $Pb_2O_3$, for example. Thus, the melting (or softening) point of $SiO_2$ can be lowered from 1250° C. to about 700° C. by adding $Pb_2O_3$ to it.

Figure 4:
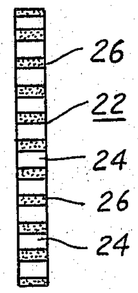
FIG. 4 is an end elevational view of one form of a composite wafer in accordance with the present invention.
Figure 5:
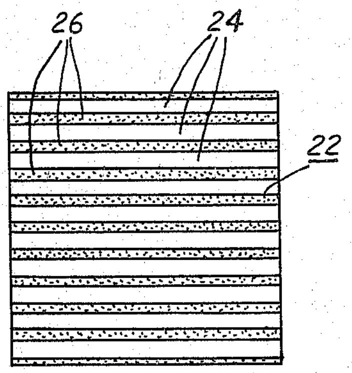
FIG. 5 is a side elevational view of the composite wafer illustrated in FIG. 4.

The stack 16 of fused oxidized sheets 10 is now sliced, preferably by cutting the stack 16 perpendicularly to the surfaces of the oxide layers 12 and 14, as shown by the slice 22 in FIGS. 4 and 5. The slice 22 may be one cut by, and included between, the planes indicated by the lines 25 and 27 in FIG. 3, and has new major surfaces normal to the old. The slice 22 is a composite wafer comprising elongated strips 24 of silicon separated from each other by fused silicon dioxide 26. Thus, adjacent strips 24 of silicon are separated from each other by a good electrical insulator, silicon dioxide 26.

Figure 6:
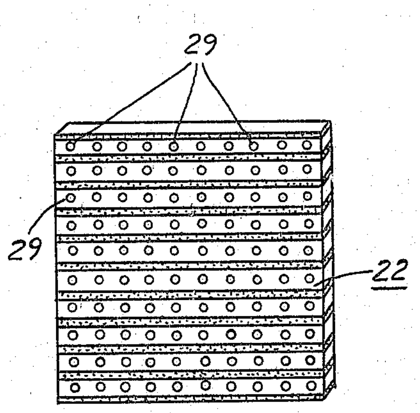
FIG. 6 is a perspective view of the composite wafer illustrated in FIGS. 4 and 5, having, in addition, elements diffused in portions of the semiconductor material.

Active electronic components, such as diodes and transistors, for example, may be formed on exposed surfaces of the strips 24 of doped silicon on the major surface of the slice 22 by any suitable techniques known in the art. Thus, for example, by the techniques described in U.S. Patent 2,802,760, issued to L. Derick et al., on August 13, 1957, for Oxidation of Semiconductive Surfaces for Controlled Diffusion, a plurality of diodes may be formed in each of the strips 24 by diffusing suitable electron donor or acceptor elements (impurities) from "dots" 29 of such elements into the exposed surfaces of the strips 24, as illustrated in FIG. 6, for example, in a regular array, many dots to a row. Where, for example, the doped strip 24 is N-type silicon, the elements 29 are P-type (electron acceptor impurity) elements, such as boron. If the strips 24 of the slice 22 are of P-type silicon, the elements 29 diffused into the surface of the strips 24 would be N-type, such as phosphorus.

Transistors may also be formed in the strips 24 by known methods, for example, such as the method described in the aforementioned patent, as by first diffusing an element 29, whose conductivity is of a type opposite to that of the doped strip 24, into the surface of the strip 24, and then diffusing another element of the same conductivity type as the semiconductor material of the strip 24 over a portion of the aforementioned diffused element 29. Suitable electrodes (not shown) may be connected to the strips 24 and to the diffused elements 29 in a manner known in the art to provide interconnecting means for the active components.

A checkerboard-like composite wafer 30, such as shown in FIG. 9, may be formed from a stack of fused oxidized slices 22 of the type shown in FIGS. 4 and 5. The slices 22 are oxidized by any known means, as by heating them in steam at a temperature between 1200 to 1250° C., until oxide layers 34 and 36 of a desired thickness form on the opposed major surfaces, respectively, of each slice 22. A plurality of oxidized slices 22 are superimposed on each other with the oxide layer 34 of one slice 22 adjacent to the oxide layer 36 of an adjacent slice 22 to form a stack 38, as shown in FIG. 8. The number of oxidized slices 22 in the stack 38 is a matter of choice, depending upon the size of the composite wafer 30 desired. The stack 38 is disposed between graphite blocks 40 and 42 so that it may be compressed in a press with a pressure of about one ton per square inch in the directions indicated by the arrows 37 and 39, normal to the major surfaces. The stack 38 is heated to a temperature between 1200 to 1250° C. while under pressure until the oxide layers 34 and 36 soften so that adjacent oxidized slices 22 become fused (bonded) to each other, whereby the stack 38 forms an integral structure.

The stack 38 may now be sliced transversely to (preferably normal to) the oxide layers 34 and 36 to form a plurality of checkerboard-like composite wafers 30 wherein discrete pieces 44 of silicon are separated from each other by fused silicon dioxide 46, and the new major surfaces are normal to those of the original wafers and also to those formed by the first slices. Suitable donor or acceptor elements 29 may be diffused into the pieces 44 of the composite wafer 30 on the newly formed major surfaces transverse to the original ones to form desired active components, each insulated from the other, by any suitable known techniques, as, for example, by the techniques described in the aforementioned patent:

From the foregoing description, it will be apparent that there has been provided an improved insulator-semiconductor wafer and method of making it. While only two embodiments of the invention have been described, variations in the design of the composite wafers and the methods of making them, all coming within the spirit of this invention, will, no doubt, readily suggest themselves to those skilled in the art. Hence, it is desired that the foregoing description shall be considered as illustrative and not in a limiting sense.

What is claimed is:

1. A method of making a composite insulator-semiconductor wafer comprising the steps of (a) forming an oxide on a plurality of sheets of semiconductor material, (b) superimposing said oxidized sheets over each other to form a stack, (c) heating said stack while applying pressure thereto to fuse said oxide of said oxidized sheets, whereby to bond said sheets together, and
(d) cutting at least one slice through said stack at an angle to said sheets, whereby to obtain said composite wafer.

2. A method of making a composite insulator-semiconductor wafer comprising the steps of
(a) forming an oxide on the surfaces of a plurality of sheets of semiconductor material,
(b) superimposing said oxidized sheets over each other to form a stack,
(c) heating said stack to a temperature between 1200 and 1250° C. under pressure of about one ton per square inch for about three minutes to fuse said oxide of said oxidized sheets to each other, and
(d) cutting at least one slice at an angle through said stack, whereby to obtain said composite wafer.

3. A method of making a composite insulator-semiconductor wafer comprising the steps of
(a) oxidizing a plurality of sheets of silicon to form a layer of silicon dioxide thereon,
(b) arranging said oxidized sheets in a stack,
(c) heating said stack under pressure at a temperature and pressure sufficient to fuse said silicon dioxide on adjacent sheets, whereby to form a stack of unitary structure, and
(d) cutting at least one slice at an angle through said fused stack, whereby to obtain said composite wafer.

4. A method of making a composite insulator-semiconductor wafer comprising the steps of
(a) forming an oxide on a plurality of sheets of semiconductor material,
(b) superimposing said oxidized sheets over each other to form a first stack,
(c) applying pressure across said first stack,
(d) heating said pressurized first stack until said oxide on adjacent sheets fuses,
(e) cutting said first stack into slices, each slice being cut at an angle to the large surfaces of said sheets,
(f) forming an oxide on said slices,
(g) superimposing said oxidized slices over each other to form a second stack,
(h) heating said second stack while applying pressure across said second stack to fuse said oxide on adjacent ones of said slices, and
(i) slicing said second stack at an angle to said slices to form said composite wafer.

5. A method of making a composite insulator-semiconductor wafer comprising the steps of
(a) oxidizing a plurality of sheets of semiconductor material to form an oxide layer thereon, (b) superimposing said oxidized sheets over each other to form a first stack,
(c) applying pressure of about one ton per square inch across said first stack,
(d) heating said pressurized first stack between 1200 and 1250° C. until said oxide layers on adjacent ones of said sheets fuse to each other,
(e) cutting said first stack into slices, each slice being cut at an angle to the large surfaces of said sheets,
(f) oxidizing said slices to form an oxide thereon,
(g) superimposing said oxidized slices over each other to form a second stack,
(h) heating said second stack while applying pressure across said second stack to fuse said oxide on adjacent ones of said slices to each other, and
(i) slicing said second stack at an angle to said slices to form said composite wafer.

6. A method of making a composite insulator-semiconductor wafer comprising the steps of
(a) oxidizing a plurality of sheets of silicon to form silicon dioxide thereon,
(b) superimposing said oxidized sheets over each other to form a first stack,
(c) applying pressure across said first stack,
(d) heating said pressurized first stack until said silicon dioxide on adjacent ones of said sheets fuses, whereby to bind said sheets together,
(e) cutting said first stack into slices, each slice being cut at an angle to the large surfaces of said sheets,
(f) oxidizing said slices to form silicon dioxide thereon,
(g) superimposing said oxidized slices over each other to form a second stack,
(h) heating said second stack while applying pressure across said second stack to fuse said silicon dioxide on adjacent ones of said slices, whereby to form a unitary structure of said second stack, and
(i) slicing said second stack at an angle to the large surfaces of said slices, each of said slices comprising one of said composite wafers.

References Cited by the Examiner

UNITED STATES PATENTS

| | | | |
|---|---|---|---|
| 2,088,949 | 8/1937 | Fekete | 29—25.42 |
| 2,673,792 | 3/1954 | Gulton | 161—225 |
| 3,114,088 | 12/1963 | Abercombe | 148—33 |
| 3,122,817 | 3/1964 | Andrus | 148—1.5 |
| 3,192,081 | 6/1965 | Cocca | 148—1.5 |
| 3,194,690 | 7/1965 | Grasser | 148—1.5 |
| 3,200,017 | 8/1965 | Pell | 148—33 |
| 3,206,832 | 9/1965 | Strother | 29—155.5 |

HYLAND BIZOT, *Primary Examiner.*